(12) United States Patent
Marshall et al.

(10) Patent No.: US 6,858,912 B2
(45) Date of Patent: Feb. 22, 2005

(54) PHOTODETECTOR CIRCUIT

(75) Inventors: Gillian F Marshall, Malvern (GB); David J Robbins, Malvern (GB); Wang Y Leong, Malvern (GB); Steven W Birch, Malvern (GB)

(73) Assignee: QinetiQ Limited, Farnborough (GB)

( * ) Notice: Subject to any disclaimer, the term of this patent is extended or adjusted under 35 U.S.C. 154(b) by 0 days.

(21) Appl. No.: 09/923,341

(22) Filed: Aug. 8, 2001

(65) Prior Publication Data

US 2002/0024058 A1 Feb. 28, 2002

(30) Foreign Application Priority Data

Aug. 16, 2000 (GB) .............................................. 0020029

(51) Int. Cl.$^7$ ...................... H01L 31/072; H01L 31/107; H01L 27/095
(52) U.S. Cl. ....................... 257/438; 257/446; 257/186; 257/458; 257/484; 257/461
(58) Field of Search ................................ 257/438, 446, 257/186, 458, 484, 461

(56) References Cited

U.S. PATENT DOCUMENTS

| 4,127,932 | A | | 12/1978 | Hartman et al. |
| 4,442,444 | A | | 4/1984 | Osaka |
| 4,491,802 | A | * | 1/1985 | Uchida et al. ............... 330/260 |
| 4,689,305 | A | | 8/1987 | Stiffey et al. |
| 5,144,381 | A | * | 9/1992 | Furuyama et al. ........... 257/186 |
| 5,236,871 | A | | 8/1993 | Fossum et al. |
| 5,354,707 | A | | 10/1994 | Chapple-Sokol et al. |
| 5,483,200 | A | * | 1/1996 | Okabayashi et al. ......... 330/308 |
| 5,596,186 | A | | 1/1997 | Kobayashi |
| 5,621,227 | A | | 4/1997 | Joshi |
| 5,783,839 | A | | 7/1998 | Morikawa et al. |
| 5,796,118 | A | | 8/1998 | Morikawa et al. |
| 6,005,266 | A | * | 12/1999 | Forrest et al. ............... 257/258 |
| 6,043,517 | A | | 3/2000 | Presting et al. |
| 6,100,551 | A | * | 8/2000 | Lee et al. .................... 257/232 |
| 6,107,619 | A | * | 8/2000 | Cunningham et al. ....... 257/208 |
| 6,392,282 | B1 | * | 5/2002 | Sahara et al. ................ 257/438 |
| 6,407,442 | B2 | * | 6/2002 | Inoue et al. ................. 257/535 |
| 6,417,504 | B1 | * | 7/2002 | Kozlowski .............. 250/214 R |
| 2001/0002045 | A1 | * | 5/2001 | Fossum et al. ................. 257/1 |

FOREIGN PATENT DOCUMENTS

| EP | 0540235 | 5/1993 |
| EP | 0 967 656 | 12/1999 |
| GB | 2202624 | 9/1988 |
| JP | 10-190041 | 7/1998 |

OTHER PUBLICATIONS

E. Fossum, "Image Capture Circuits in CMOS" 1997 International Symposium on VLSI Technology, Systems, and Applications.

N. Tu et al, "CMOS Active Pixel Image Sensor With Combined Linear and Logarithmic Mode Operation" Electrical and Computer Engineering, 1998, pp. 754–757.

T. Delbruck et al, "Adaptive Photoreceptor With Wide Dynamic Range" Circuits and Systems, 1994, pp. 339–342.

* cited by examiner

Primary Examiner—George Eckert
Assistant Examiner—Joseph Nguyen
(74) Attorney, Agent, or Firm—Nixon & Vanderhye P.C.

(57) ABSTRACT

A photodetector circuit incorporates an avalanche photodiode (APD) 300 produced by epitaxy on a CMOS substrate 302 with implanted n-well 304 and p-well 306. The n-well 304 has an implanted p+ guard ring 310 delimiting the APD 300. Within the guard ring 310 is an implanted n+ APD layer 312 upon which is deposited an epitaxial p+ APD layer 314, these layers forming the APD 300. The APD may be incorporated in an amplifier circuit 50 providing feedback to maintain constant bias voltage, and may include an SiGe absorption region to provide extended long wavelength response or lower avalanche voltage. Non-avalanche photodiodes may also be used.

27 Claims, 10 Drawing Sheets

PHOTODETECTOR CIRCUIT

This invention relates to a photodetector circuit, an array of photodetector pixel circuits and a method of making such a circuit and array.

There is a long-felt want for a photodetector circuit suitable for a solid state imaging system or camera operative under daytime and night-time conditions. It should be capable of imaging in illuminating radiation intensities extending from direct sunlight down to sub-twilight: i.e. its illumination sensitivity should preferably extend over 8 decades or approach this range as nearly as possible, although not necessarily in a single operating mode. Its simultaneous dynamic range of illumination sensitivity, i.e. its illumination sensitivity in any one mode of operation, should preferably be at least 4 and possibly 6 decades, although for some applications such as sub-twilight imaging two or three decades of sensitivity would be adequate.

Another important consideration is whether or not a photodetector circuit is suitable for replication to provide an array of pixel circuits: this requires the circuits to be physically small, implementable as integrated circuits and to have properties which are either accurately reproducible or adjustable to produce like properties. Discrete components such as operational amplifiers are too large to be incorporated in individual pixel circuits.

Existing technology cannot meet these objectives. The prior art includes photodetectors consisting of arrays of charge-coupled devices (CCDs) which provide reasonable sensitivity to twilight levels of illumination if detector signals are integrated for longer than is normal. However, CCD camera images bloom and go into saturation (loss of image contrast) at high illuminating radiation intensities; moreover, they have poor simultaneous dynamic range (2 or 3 decades) and consequently cannot resolve image features in both sunlight and shadow simultaneously, i.e. within the same image frame.

U.S. Pat. No. 4,821,103 to Busby relates to a high dynamic range CCD camera which takes two exposures per frame, one of which is relatively short and the other relatively long, and then combines the two non-linearly in signal processing. Image regions of high and low illuminating radiation intensity are taken from the short and long exposures respectively. This is sometimes called multi-framing. It has an extended dynamic range compared to a standard CCD camera, but it gives rise to image artefacts in transitions between the two exposures or integration times. It is prone to image saturation, and there is difficulty in choosing appropriate integration times. It requires a companion digital signal processing (DSP) circuit to combine image regions of high and low intensity, and so has relatively high power requirements.

In Proc SPIE pp 19–29, vol. 2172, Charge Coupled Devices and Solid State Optical Sensors IV, January 1994 Mendis et al disclosed cameras with detectors in the form of arrays of silicon p-n diodes: the diodes were on complementary metal oxide/silicon-on-silicon substrates (CMOS-on-Si), and provided a linear response. Such detectors have a performance similar to that of CCDs, i.e. with the same limitations on simultaneous dynamic range in particular, but they make it possible to operate at lower power consumption than a CCD array of comparable resolution.

In Proc. IEEE Workshop on Charge Coupled Devices and Advance Imaging Sensors 1997, O Yadid-Pecht and E Fossom gave a paper entitled "Wide intrascene dynamic range CMOS APS using dual sampling": this paper relates to a multi-framing CMOS camera, which, like a CCD equivalent, images different regions of an image with different exposures appropriate to their respective brightnesses. An image is reconstituted as a piece-wise linear or non-linear sum of sub-images from respective exposures. This may extend dynamic range compared to a standard CMOS camera, but not to a sufficient degree to cope with variation in illuminating radiation intensity in a wide variety of natural scenes. Here again image artefacts are likely at transitions between exposures, there is difficulty over integration times, and once more a DSP circuit is needed which increases power requirements.

In Proc Advanced Focal Plane Arrays and Electronic Cameras 1996, a paper entitled "Random addressable active pixel image sensors" by Dierickx et al disclosed logarithmic CMOS imaging systems with photodiode detectors dealing with the dynamic range problem. These have a very high simultaneous dynamic range of up to 6 decades, which allows imaging from twilight to direct sunlight. Unfortunately they are characterised by thermal noise and unwanted artefacts arising from mismatch of pixel circuit elements (metal oxide—semiconductor field effect transistors or MOSFETs), too severe to achieve imaging significantly below twilight. Some systems of this kind also have a bandwidth (slew rate or speed of response) that is dependent on illumination level, and causing response to slow at low illuminating radiation intensities or levels.

International Patent Application No. WO 98/58411 relates to a phototransistor pixel circuit with logarithmic output for use in an imaging system. The circuit has a high simultaneous dynamic range of up to 5 decades or so: it has more gain than a photodiode-based circuit and so has better sensitivity at low illumination levels. Its gain is fixed by phototransistor geometry and doping concentrations, so improving gain at low illumination levels increases the tendency to saturate, i.e. it reduces the illumination level at which saturation occurs. In consequence the illumination intensity range over which such a circuit provides imaging sensitivity merely shifts towards lower levels at the expense of higher levels.

An avalanche photodiode (APD) detector array has been investigated for use in imaging systems by A Biber and P Seitz, and is reported in the Proceedings of the IS&T/SPIE Conference on Sensors, Cameras and Systems for Scientific/Industrial Applications, California 1999, pages 40–49. This reference discloses APDs produced using Si-CMOS technology (implantation or diffusion) and biased into a sub-Geiger (otherwise called linear) mode of operation. Unfortunately, it has been found that it is difficult to produce APD detector arrays in which the APDs are sufficiently small and uniform to provide acceptable resolution and image quality.

A night vision device is known which consists of an electron multiplier coupled to a CCD array. A photocathode converts photons from a scene to electrons, which are accelerated through a microchannel plate and detected by a conventional CCD array. The combination operates at levels of illumination as low as starlight. The microchannel plate has however a very low simultaneous dynamic range giving rise to saturation in response to comparatively low illumination levels often producing unwanted halo artefacts. It is damaged if accidentally exposed to normal light levels, so cannot be used in a camera for both day and night use.

Other known imaging devices include electron-bombarded CCDs and transferred-electron CCDs. In these again a photocathode converts photons from a scene to electrons, which are accelerated in a vacuum before striking a CCD array and producing an intensified image. They have a simultaneous dynamic range no greater than that of their CCD arrays. Moreover, they require a high vacuum and high voltages, which makes them expensive and high in power consumption.

It is an object of the invention to provide an alternative form of photodetector circuit.

In one aspect, the present invention provides a photodetector circuit including a photodiode detector and an associated readout circuit, characterised in that the circuit incorporates a CMOS component, at least one epitaxial layer which is an active region of the photodiode detector and a guard ring delimiting the photodiode detector to enhance electric field uniformity and inhibit premature breakdown.

As will be described later in more detail, in this aspect the invention provides the advantage that epitaxy provides a number of improvements in photodiode characteristics combined with the low cost of CMOS technology, while the guard ring reduces the scope for localised high electric fields and improves breakdown characteristics.

The CMOS component may be a substrate supporting and insulated from CMOS circuitry, and the photodiode detector may be operable in a current multiplication mode and comprise at least one region epitaxially deposited upon the substrate. The photodiode detector may be a PIN structure.

The photodiode detector may be an avalanche photodiode comprising a first region of one conductivity type incorporated in the substrate, the at least one epitaxial layer being a layer upon the first region and providing a second avalanche photodiode region The photodiode detector may alternatively comprise a first region of one conductivity type incorporated in the CMOS component, the at least one epitaxial layer comprising two epitaxial layers one substantially undoped and the other of opposite conductivity type to the first region, and the first region and two epitaxial layers being configured as a PIN diode. The undoped epitaxial layer may be SiGe alloy or a quantum well structure of the $Si_{1-x}Ge_x$ material system where the value of the compositional parameter x changes between successive layers.

In another aspect, the present invention provides a photodetector circuit including a photodiode detector and an associated readout circuit, characterised in that it is arranged to provide a logarithmic response to incident radiation and incorporates at least one silicon-germanium alloy region arranged for photon absorption to which the circuit is responsive, such region being in at least one of the photodiode detector and a substrate supporting the circuit.

In this aspect the invention provides the advantage of extended long wavelength response to incident radiation.

The circuit of the invention may incorporate parasitic photodiodes arranged to contribute to circuit output in response to incident radiation. The photodiode detector may be an avalanche photodiode.

The circuit may include an amplifier arranged to amplify detector output and provide feedback to a transistor load in series with the detector to stabilise detector bias voltage. The amplifier may be a push-pull amplifier and may include a cascode transistor arranged to reduce Miller Effect capacitance.

In another aspect, the present invention provides an array of photodetector pixel circuits each including an avalanche photodiode detector and an associated readout circuit, characterised in that each pixel circuit also includes an amplifier arranged to provide feedback to a transistor load in series with the detector to stabilise photodiode detector bias voltage and to provide an output indicating radiation intensity illuminating the detector, and each readout circuit is implemented by circuit elements integrated within the respective pixel circuit.

In this aspect the invention provides the advantage that it greatly reduces the need to charge and discharge avalanche photodiode detectors and associated capacitance in an pixel array, and so improves operating speed of response to incident radiation.

Each avalanche photodiode detector may comprise epitaxial semiconductor material upon a substrate, the amplifier being incorporated in CMOS circuitry supported by the substrate but insulated from it. The epitaxial semiconductor material may comprise two epitaxial layers which in combination with the substrate provide a PIN diode structure.

For each photodetector pixel circuit the substrate may have an in-diffusion of dopant material providing one region of the associated avalanche photodiode.

Each avalanche photodiode detector may be operable in a current multiplication sub-Geiger mode at low incident radiation intensities and in a non-multiplication mode at high incident radiation intensities.

In an alternative aspect, the present invention provides a method of making a photodetector circuit incorporating a photodiode detector and an associated readout circuit, the method including the step of producing a CMOS circuit component, characterised in that the method also includes the step of producing upon the CMOS circuit component at least one epitaxial layer providing an active region of the photodiode detector and a guard ring delimiting the photodiode detector to enhance electric field uniformity and inhibit premature breakdown.

In this aspect the invention provides the advantage of combining the cheapness of CMOS with the controllability of epitaxy to give good photodiode properties.

The method may include the steps of producing a guard ring on the CMOS circuit component and forming a first region of one conductivity type within the guard ring, the step of producing the at least one epitaxial layer comprising producing one such layer upon the first region. The epitaxial layer may be surmounted by a layer of opposite conductivity type to the first region, and the surmounting layer may be a layer of polycrystalline silicon. The photodiode detector may be an avalanche photodiode.

The method may include the step of producing a first region of one conductivity type incorporated in the CMOS component, the step of producing the at least one epitaxial layer comprising producing two epitaxial layers one of which is substantially undoped and the other of which is of opposite conductivity type to that of the first region, and configuring them with the first region as a PIN avalanche photodiode.

The undoped epitaxial layer may be SiGe alloy or a quantum well structure of the $Si_{1-x}Ge_x$ material system where the value of the compositional parameter x changes between successive layers.

In another alternative aspect, the present invention provides a method of making a photodetector circuit incorporating a photodiode detector and an associated readout circuit, the method including the step of producing a CMOS circuit component, characterised in that the CMOS circuit component is a substrate bearing an insulating region itself supporting the readout circuit, the readout circuit is a CMOS structure, and the method includes producing upon the substrate:

(a) at least one epitaxial layer providing an active region of the photodiode detector, and (b) a guard ring delimiting the photodiode detector to enhance electric field uniformity and inhibit breakdown.

The at least one epitaxial layer may be an epitaxial layer which is substantially undoped and providing a central high field region of the photodiode detector between two other detector regions, the other detector regions being of mutually opposite conductivity type. One of the other detector regions may be a doped region of the substrate.

In order that the invention might be more fully understood, embodiments thereof will now be described, by way of example only, with reference to the accompanying drawings, in which.

Figure 19:
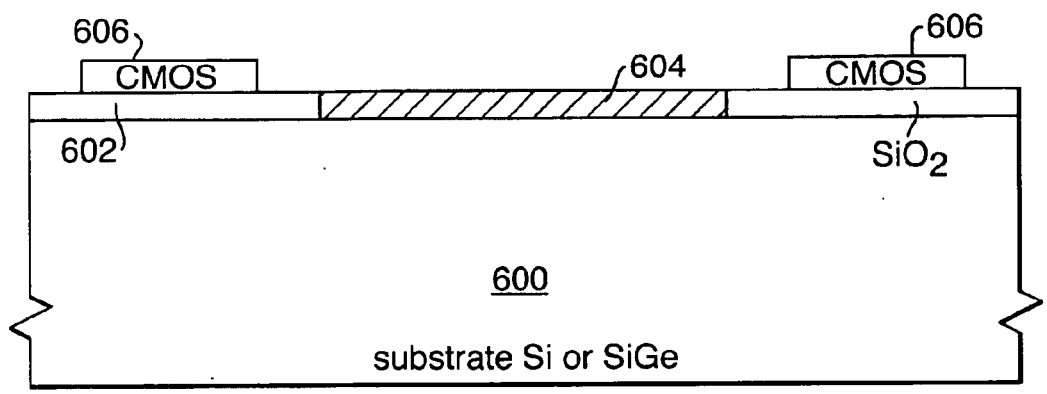
Figure 20:
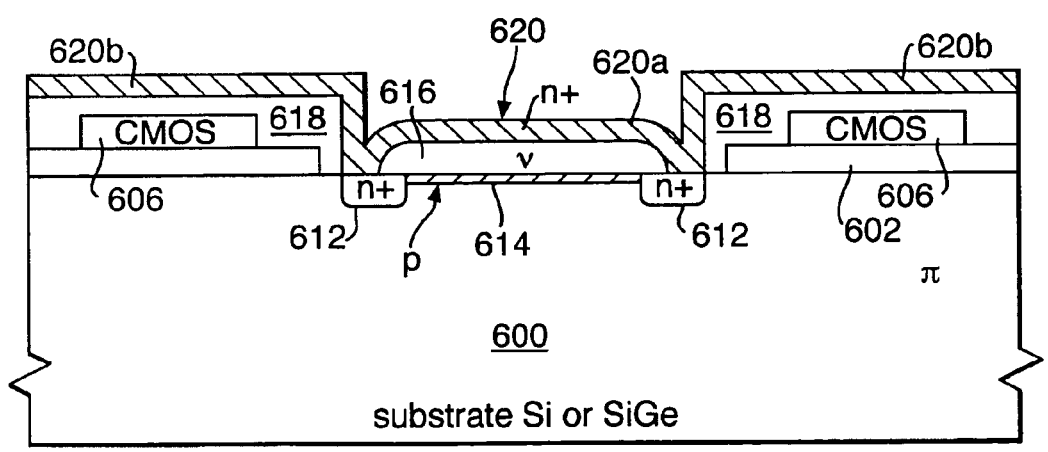

FIGS. 19 and 20 schematically show stages in the manufacture of an APD detector structure formed from an epitaxial layer on a CMOS substrate.

Figure 1:
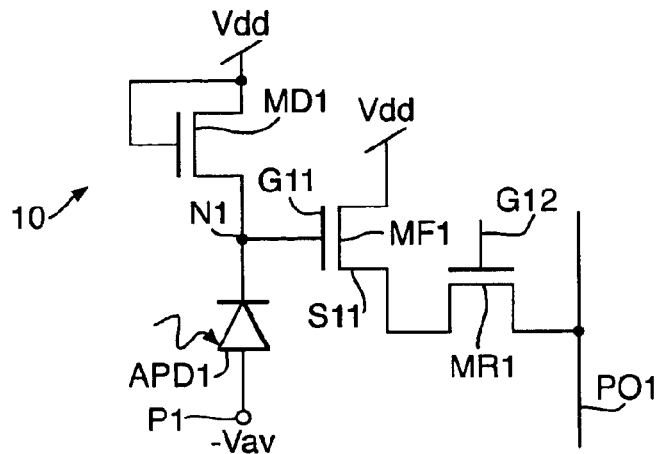
FIG. 1 is a schematic drawing of a logarithmic n-channel pixel circuit of the invention incorporating an avalanche photodiode (APD) detector.

Referring to FIG. 1, a logarithmic pixel circuit 10 of the invention is shown incorporating an APD detector APD1 in series with a logarithmic load in the form of a diode-connected MOSFET MD1. The circuit 10 was fabricated using conventional complementary metal oxide-silicon (CMOS) technology. The detector APD1 and MOSFET MD1 have a common connection at a first circuit node N1: the detector APD1 is connected between this node and a second circuit node P1 maintained at a constant negative bias voltage of −Vav of 22.5 volts. The first circuit node N1 is itself connected to a control gate G11 of a MOSFET source follower MF1, which has a source S11 connected via a MOSFET readout switch MR1 to a pixel output line PO1. The MOSFETs MD1, MF1 and MR1 are n-channel devices. Forward (positive) biasing of a control gate G12 of the switch MR1 activates the latter to transfer the signal at node N1 via the source follower MF1 to the pixel output line PO1. The MOSFETs MD1, MF1 and MR1 collectively constitute readout circuitry and are operated at low voltage, i.e. not more than 5V, less than that used for biasing the detector APD1 in this example: this reduces stress on the circuit 10.

It will be appreciated by those skilled in the art of solid state devices that the quoted circuitry and APD voltages of 5V and 22.5V reflect current technology—such voltages would be expected to be reduced in like APD circuitry implemented in future technologies. It is also possible to optimise current CMOS technology by appropriate doping to reduce the APD voltage necessary for adequate gain, i.e. to 15V or thereabouts. Moreover, the bias voltage of the detector APD1 is determined by the electric field and the layer thickness in the avalanche region together with the gain required. Reduction in gain required allows APD bias voltage to be reduced.

Like its vacuum tube equivalent, an avalanche photodiode has four possible modes of operation depending on the magnitude of its reverse bias voltage. At very low bias voltage, ignoring leakage current, electron-hole pairs are created as ionisation caused by incident photons: a proportion of these pairs recombine in the photodiode's active region and the reminder are swept away by the bias field to contribute to the current. The current in the photodiode is proportional to the bias voltage, because increased bias increases carrier velocity and reduces time for recombination. At higher but still low bias voltage, the bias field become high enough to ensure that virtually all photo-ionised charge carriers are collected without recombination, and photodiode current is largely independent of bias. At intermediate bias voltage, charge carriers created by incident photons are accelerated sufficiently to cause collision ionisation producing further carriers, i.e. current multiplication, and the current in the photodiode (and hence its gain) is proportional to bias voltage. At high bias voltage, photo-ionised charge carriers are accelerated sufficiently to ionise substantially all of the photodiode's active region, giving a saturation current pulse which is largely bias independent. The high and intermediate bias modes are often referred to as the Geiger and sub-Geiger modes by analogy with the well-known Geiger tube.

In the present invention, the detector APD1 is operated in the sub-Geiger or intermediate bias mode and therefore has bias-dependent current and gain. The first circuit node N1 is at a voltage which is dependent on the radiation intensity incident on the detector APD1: the reverse bias across the detector APD1 is the difference between the voltages at nodes N1 and P1, which will therefore vary with this incident intensity. Moreover, the speed of response of the circuit 10 falls at low incident intensities because it has been discovered that charge and discharge rates of capacitance associated with gate G11 are not equal, which affects the rate of change of the voltage at the first circuit node N1: this voltage depends on photocurrent charging or discharging of the capacitances of the detector APD1, gate G11 and associated node parasitic capacitances, and low photocurrent means slow voltage change; the voltage at node N1 is actively pulled down when the detector APD1 is illuminated, and the magnitude of this effect is a function of illumination intensity. It is also subject to weak and constant pull-up through the load MOSFET MD1.

Since the detector APD1 gain is controlled by its reverse bias voltage, it is possible to introduce additional gain as and when needed in response to low incident radiation intensity; a current multiplication or gain of 30 is chosen for an APD safely biased below its electrical breakdown field. At higher illumination levels a low bias is used and the detector APD1 is operated below avalanche in a conventional pn diode mode. Adjustable detector gain offers an important advantage of instantaneous dynamic range of at least five decades being available with an output signal proportional to the logarithm of incident radiation intensity because of the diode connected load MD1: this range is independent of incident radiation intensity and detector gain setting.

Electronically controllable APD gain enables the available APD response range to be moved up and down to cover a greater total range of incident radiation intensities. The gain is different during daytime and night-time, with greater gain and therefore sensitivity at night, but with high simultaneous dynamic range at all times. By increasing the reverse bias voltage across the APD1 in response to reduction in incident radiation intensity, the pixel circuit may be made automatically reconfigurable to change detector gain as appropriate to changing conditions in a scene being monitored, e.g. at nightfall. For this purpose, incident radiation intensity may be averaged over a scene or over a scene region: averaging over a scene is simplest, but averaging over a scene region is also possible if for example it is convenient for different groups of APDs in a detector array to have different gains to image different scene region radiation intensities. The latter would require signal processing to remove discontinuity effects arising from boundaries between APD groups of differing gain, but would give enhanced simultaneous dynamic range.

Figure 2:
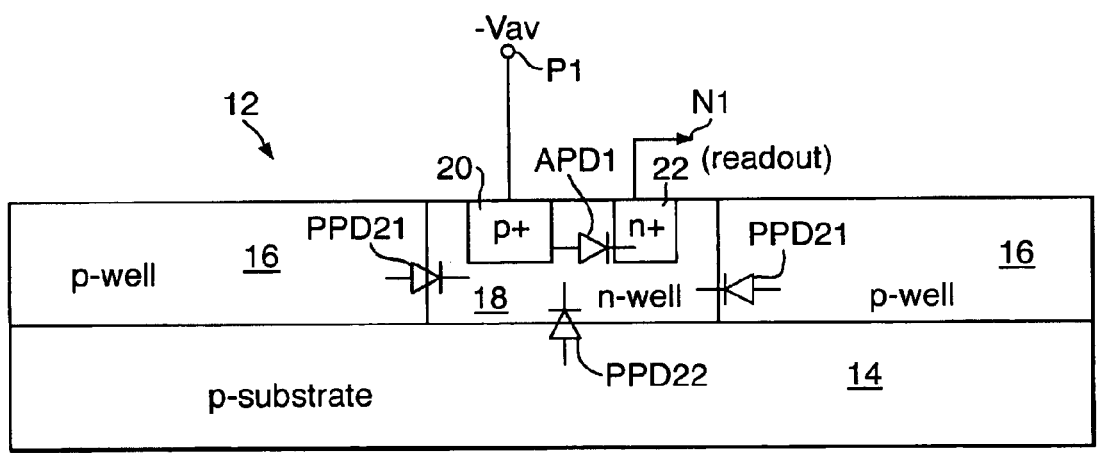
FIG. 2 is a sectional view of a CMOS structure in which the APD in the circuit of FIG. 1 is formed.

Referring now also to FIG. 2, a CMOS structure 12 in which the detector APD1 is formed is shown in section, parts described earlier being like-referenced. The structure 12 is intended to represent a part of a pixel circuit, this circuit being a member of an array of pixel circuits incorporated in a single integrated circuit (not shown) on a common substrate part of which is shown at 14. The substrate 14 is p-type Si: it has formed upon it a p-type well 16 and an n-type well 18, the former surrounding the latter; these wells are produced by diffusion of dopants into the substrate 14. The n-type well 18 has p+ and n+ implanted/diffused regions 20 and 22, "+" indicating high doping.

The detector APD1 appears in the n-type well 18 between the p+ region 20 and the remaining n-type regions of that well, the latter being connected to node N1 via the n+ region 22 and thence to the readout circuitry, i.e. MOSFETs MD1, MF1 and MR1 (not shown) integrated on the substrate 14 nearby. In an array of photodiode detector APDs implemented as in FIG. 2, each APD would occupy a separate floating n-well integrated in a p-type substrate.

The detector capacitance is largely that attributable to the n-type well 18 within which the detector APD1 is formed, and it affects the response speed of the circuit 10. There are also parasitic p-n photodiodes PPD21 and PPD22 between the n-type well 18 and the surrounding p-type well 16 and p-type substrate 14: they are not APDs, but, if not shielded from radiation incident on the structure 12, they respond to it by producing electron-hole pairs. The photodiodes PPD21 and PPD22 provide a degree of isolation between the detector APD1 and the surrounding p-type well 16 and p-type substrate 14.

The p-type well 16 is annular, and so also is photodiode PPD21, which in sectional view apparently appears at two positions. The photodiodes PPD21 and PPD22 are effectively in parallel with the APD1 and series with the n+ region 22 connected to readout circuitry: they therefore increase the photon-produced charge carrier concentration obtained by the circuit 10, thereby increasing the circuit's fill factor (that fraction of the circuit area exposed to incident radiation which produces photocurrent), low-light sensitivity and signal to noise ratio.

It was convenient to use a p-type substrate 12, but in fact an APD1 can be produced which is equivalent to the structure 12 with all conductivity types inverted, ie n-type replaced by p-type and vice versa. The APD1 then has an electron-initiated avalanche with lower noise characteristics.

Figure 3:
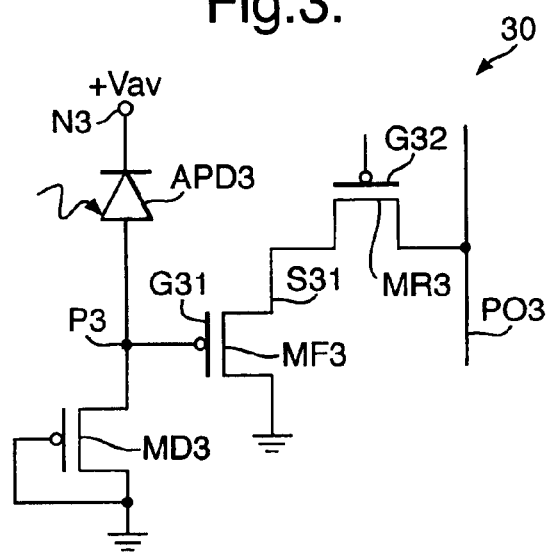
FIGS. 3 and 4 are p-channel equivalents of FIGS. 1 and 2.

Referring now to FIG. 3, there is shown a further pixel circuit 30 of the invention, which is a p-channel, equivalent of the n-channel circuit 10. It incorporates an APD detector APD3 connected a diode-connected MOSFET MD3 at a first circuit node P3: the detector APD3 is connected between this node and a second circuit node N3 maintained at a constant positive bias voltage +Vav of 22.5 volts. The first circuit node P3 is also connected to a control gate G31 of a MOSFET source follower MF3, which has a source S31 connected via a MOSFET readout switch MR3 to a pixel output line PO3. The MOSFETs MD3, MF3 and MR3 are p-channel devices as indicated by dots on for example control gate 31. The circuit 30 operates similarly to that described earlier. Forward (negative) biasing of a control gate G32 of the switch MR3 activates transference of the signal at node P3 via the source follower MF3 to the pixel output line PO3. As before, the voltage at node P3 is dependent on radiation intensity incident on the detector APD3.

Figure 4:
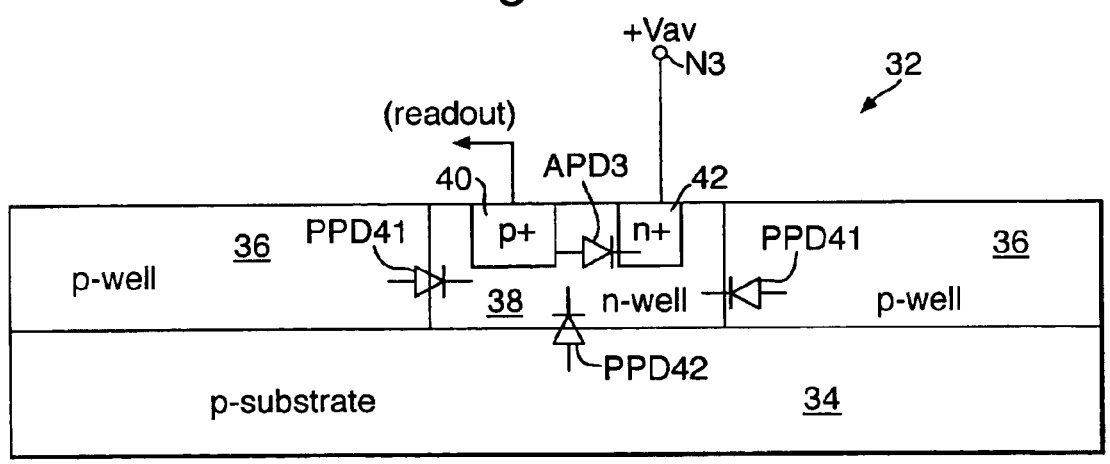

Referring now also to FIG. 4, a CMOS structure 32 in which the detector APD3 is formed is shown in section, parts described earlier being like-referenced. It includes a p-type substrate 34 upon which is a p-type well 36 surrounding an n-type well 38. The n-type well 38 has p+ and n+ implant regions 40 and 42. Unlike the structure 12, it is the n-type well 38 which is tied to high voltage Vav, allowing all APDs in an array on an integrated circuit to be placed in a common n-type well, saving space.

Parasitic p-n photodiodes PPD41 and PPD42 exist between the n-type well 38 and the surrounding p-type well 36 and substrate 34, and in operation these have a higher bias across them than the detector APD3. They might break down before the latter (since their structure cannot be well controlled); moreover, their current cannot be collected to add to the detector APD3 photocurrent, since they are effectively connected between and act as shunts across power supply connections—i.e. the substrate 34 at earth and node N3 at 22.5 volts. Simulations suggest that the n-type well to substrate junction 38/34 has the largest photocurrent, which is a disadvantage because as has been said it is not collected in this case. The circuit 30 is therefore likely to be used only when there is a particular reason for choosing a p-channel implementation.

Figure 5:
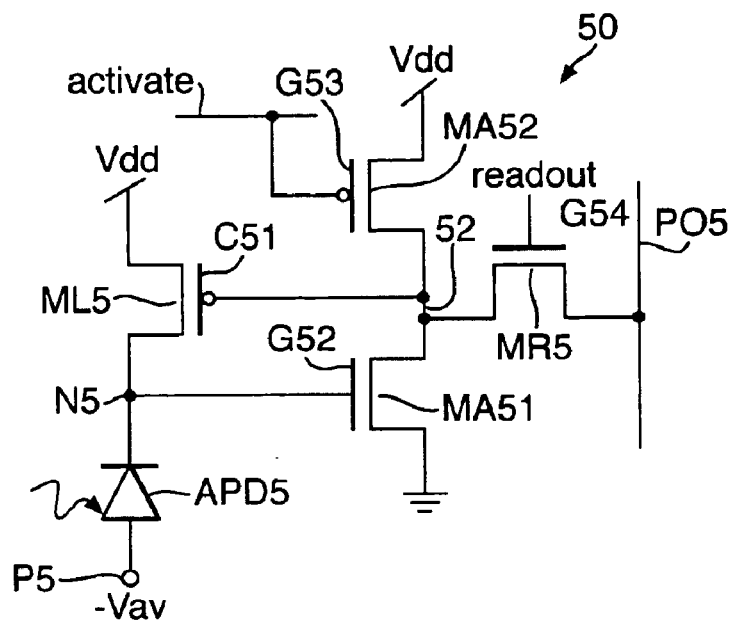
FIG. 5 is a further n-channel APD pixel circuit of the invention using feedback to counteract variation of APD gain and response speed with incident radiation intensity.

FIG. 5 shows a further APD pixel circuit 50 of the invention which uses feedback to counteract variation of APD gain with incident radiation intensity. It incorporates an APD detector APD5 connected at a first circuit node N5 to a MOSFET load ML5 and to a control gate G52 of an n-channel first amplifier MOSFET MA51. The detector APD5 is formed in the same way as the detector APD1 shown in FIG. 2, i.e. within an n-type well (not shown). It is connected between the first circuit node N5 and a second circuit node P5 maintained at a constant negative bias voltage of −Vav of 22.5 volts. The first amplifier MOSFET MA51 is connected drain to drain at 52 to a p-channel second amplifier MOSFET MA52, this combination providing a high gain amplifier stage. The second amplifier MOS- FET MA52 has a control gate G53 connected to a source of activating voltage (not shown). The common drain connection 52 is itself connected to the load MOSFET's control gate G51 and to a pixel output line PO5 via a MOSFET readout switch MR5 activated by means of a control gate G54.

The circuit 50 requires a high negative voltage (e.g. −22.5 volts) per pixel at P5, which can be in common across several pixels of an array. In this circuit (unlike circuits 10 and 30), the voltage at node N5 is stabilised by action of the load MOSFET ML5 as a result of feedback to its gate G51 from the output signal of the amplifier MOSFET pair MA51 and MA52 at the common drain connection 52: this pair provides high gain to drive the load MOSFET ML5 to keep the voltage at node N5 virtually constant. This greatly reduces the dependence of the APD output bandwidth (speed of response) upon the incident radiation intensity: this is because the node voltage and therefore that across the APD5 are substantially fixed, which avoids the need for photocurrent to charge or discharge a large capacitance significantly, ie that of the detector APD5 and associated gate and node parasitics. At low light levels photocurrent is small, and, in circuits such as 10 without feedback, photocurrent would require a relatively long time to charge or discharge this capacitance compared to the equivalent for high light levels.

The current flowing through the MOSFET amplifier pair MA51 and MA52 is controlled by a voltage from an activation source (not shown). Shortly before and during the time the pixel is to be read out, the activation source biases the gate G53 of the p-channel amplifier MOSFET MA52 to a low voltage turning this MOSFET on. The pixel circuit 50 is then read out by applying a readout voltage to the gate G54 which turns on the MOSFET switch MR5 connecting node 52 to the output line PO5. At times other than readout, the activation source holds gate G53 high to switch off the amplifier pair MA51 and MA52 and reduce power dissipation: this is an important consideration in a large array of pixel circuits.

As in the circuit 10, the APD5 is formed in an n-type well with a surrounding p-type well upon a p-type substrate: output from the APD5 is from the n-type well, allowing (non-avalanche) photon-generated current from a parasitic well-substrate photodiode (not shown—equivalent to PPD2) to be collected and added to that from the detector APD5 increasing low-light sensitivity and signal to noise ratio.

The circuit 50 also provides a logarithmic response because the APD5 produces a current which is small enough to be a sub-threshold current when sourced through the MOSFET load ML5. There is no other route for this current, and it passes in full through the MOSFET load ML5 which is therefore operating in a weak inversion mode (ie sub-threshold). The amplifier pair MA51 and MA52 together with the MOSFET load ML5 form a feedback loop driving the voltage at the load transistor gate C51 to that necessary to source the APD current: moreover, MOSFET load ML5 is operating in weak inversion, and so the voltage at gate C51 is logarithmically related to the drain current of the MOSFET load ML5. Hence the voltage at node 52 logarithmically encodes the current through the APD5.

There is appreciable capacitance between the substrate and the n-type well associated with the APD5, and also other capacitance associated with node N5: this capacitance does not greatly affect the speed of response of the circuit 50 (unlike in the circuits 10 and 30) because the feedback loop to the load transistor gate G51 ensures that the voltage of the n-type well does not alter significantly. In consequence, the charge on these capacitances remains substantially constant, allowing the circuit 50 to respond to dark and bright transitions at similar rates regardless of incident radiation intensity. Simulation indicates that the circuit 50 has a response which is approximately 70% faster for transitions at low light levels, compared to the like for the circuit 10, and the former has virtually constant bandwidth over about six decades of illuminating intensity.

Figure 6:
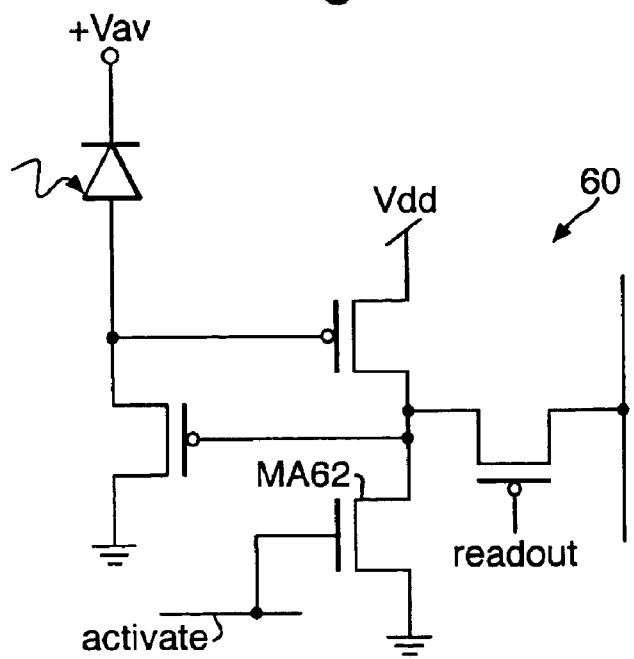
FIG. 6 is a p-channel equivalent of FIG. 5.

FIG. 6 shows a circuit 60 which is a p-channel equivalent of the circuit 50: i.e. all transistors in the circuit 60 are p-channel (indicated by dots on gates) except for one MOSFET MA61 of an amplifier pair: avalanche, readout and supply voltages are consequently inverted. It has the circuit 50 advantage of constant bandwidth, together with the circuit 30 disadvantage of insensitivity to parasitic photodiode current. In other respects it is equivalent to and operates as the circuit 50 and will not be described further.

Figure 7:
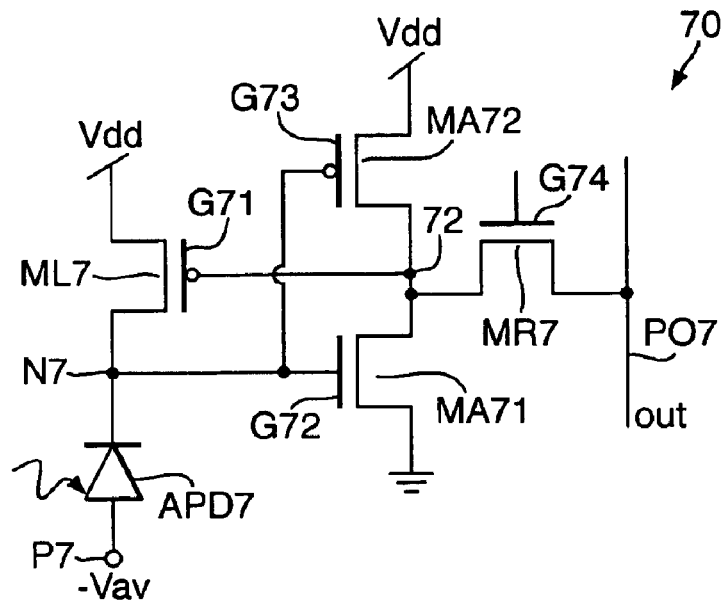
FIG. 7 is also an n-channel APD pixel circuit of the invention using push-pull amplification.

FIG. 7 shows a further APD pixel circuit 70 of the invention: it is similar to the circuit 50 except that it employs push-pull amplification and different power saving arrangements. It incorporates an APD detector APD7 connected at a first node N7 to a n-channel MOSFET load ML7 and to control gates G72 and G73 of an n-channel first amplifier MOSFET MA71 and a p-channel second amplifier MOSFET MA72 respectively. The first and second amplifier MOSFETs MA71 and MA72 are connected together drain to drain at a node 72. They collectively form a push-pull amplifier providing a much higher gain stage than the equivalent in the circuit 50.

The detector APD7 is formed in the same way as the detector APD1, ie within an n-type well (not shown). It is connected between the first circuit node N7 and a second circuit node P7 maintained at a negative bias voltage (−Vav) of 22.5 volts. The common drain connection 72 is itself connected to the load MOSFET's control gate G71 and to a pixel output line PO7 via a MOSFET readout switch MR7 activated by means of a control gate G74.

The push-pull amplifier MOSFETs MA71 and MA72 provide much greater gain than that of the circuit 50, ie a factor of five improvement: this gives a greater and therefore also faster response to a given change in input level The push-pull configuration has a penalty of drawing more current than the equivalent in the circuit 50, and therefore the power consumption is higher.

Figure 8:
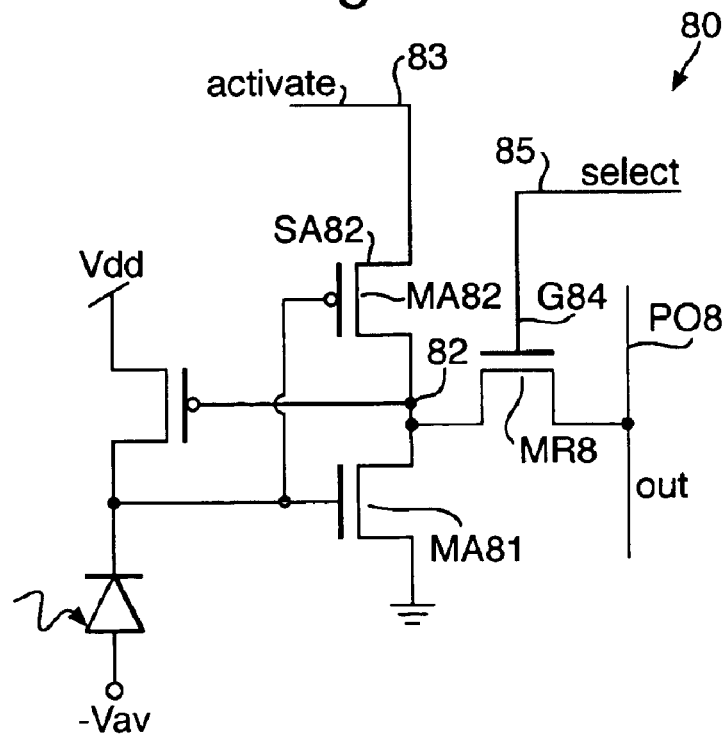
FIG. 8 is a circuit of the invention equivalent to that of FIG. 7 with the addition of power control circuitry.

FIG. 8 shows a further APD pixel circuit 80 of the invention obtaining by adding addressing circuitry to the circuit 70, and like features (if described) are like referenced except that numeral 8 replaces numeral 7. The addressing circuitry consists of an activate line 83 connected to a p-channel MOSFET amplifier source SA82 and a select line 85 connected to a readout switch gate G84. The line 83 is normally at earth potential except immediately before and during circuit readout: immediately before readout, it is switched to five volts providing a supply voltage to amplifier MOSFET pair MA81 and MA82. After a short time has elapsed enabling current in this pair to settle to a steady value, the select line 85 is switched to five volts activating the switch MR8 and connecting a circuit response signal at node 82 to output line PO8. The activate and select lines 83 and 85 are switched back to earth potential immediately after readout. This partially counteracts high power consumption, because the amplifier pair MA81 and MA82 draws current for a relatively small proportion of the time the circuit 80 is on.

Figure 9:
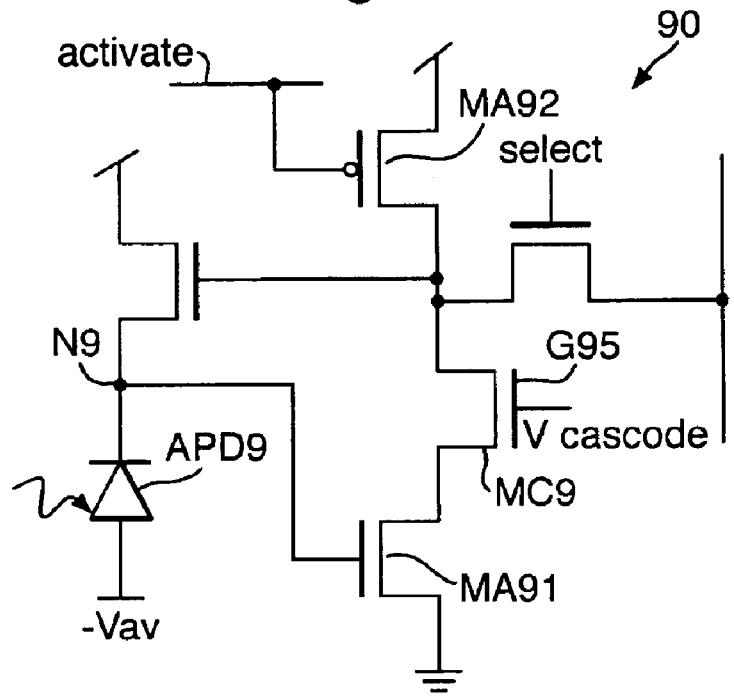
FIG. 9 is a circuit of the invention equivalent to FIG. 5 with the addition of a cascode transistor to counteract Miller Effect capacitance.

FIG. 9 shows a circuit 90 which provides a non-integrating, logarithmic response: it is equivalent to the circuit 50 with the addition of a cascode transistor MC9 between a pair of amplifier MOSFETs MA91 and MA92.

The transistor MC9 has a gate which in operation is biased at a voltage Vcascode appropriate for cascoding. It reduces a large apparent capacitance associated with node N9 and arising from Miller Effect in amplifier MOSFET MA91; it increases the speed of the circuit 90 to approaching that of the circuit 70 without the penalty of excessive power consumption. However, an increased silicon area is required for the circuit 90 compared to the latter. In other respects the circuit 90 is equivalent to that described earlier and will not be described further.

Figure 10:
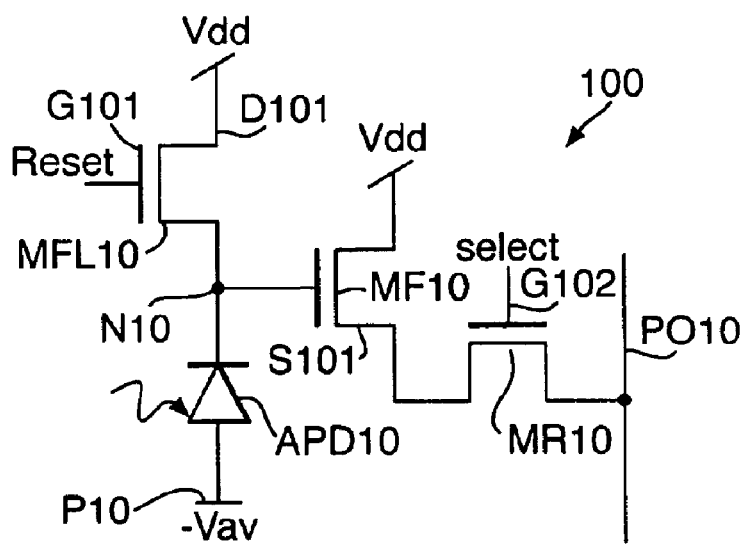
FIG. 10 is a circuit of the invention with an integrating, linear response.

In FIG. 10, a circuit 100 is shown which provides an integrating, linear response, active pixel: it is equivalent to the circuit 10 with the replacement of the diode-connected load MD1 by a transistor MF10 in series with an APD detector APD10 and lacking a connection between its gate G101 and drain D101: this gives a circuit response proportional to incident radiation intensity (ignoring offsets). Parts in the circuit 100 equivalent to those of the circuit 10 are like referenced with 10 replacing 1 or the latter's first occurrence.

The circuit 100 operates in an integrating mode as follows: firstly, as indicated by "reset" in the drawing, the gate G101 of the load MFL10 is taken to high voltage (i.e. the supply voltage Vdd); in consequence, the load MFL10 becomes low resistance taking an internal node N10 connected to the detector APD10 to high voltage. A readout transistor MR10 is then switched on by forward biasing its gate G101, and the pixel circuit's "reset level"—ie the signal at node N10 at this time—is read out by passing it to an output line PO10. Next, the gate G101 is taken to low voltage for a prearranged integration period and the load MFL10 becomes high resistance isolating the detector APD10 from the supply Vdd.

The node N10 is initially at a voltage set by (but not necessarily equal to) the reset voltage level: it is discharged by photocurrent resulting from incident radiation which makes the detector APD10 conducting. The degree to which this discharging occurs depends on the photocurrent magnitude. At the end of the integration period, the residual voltage remaining at node N10 is read out. This residual voltage is subtracted from the reset level to counteract variation in threshold voltages between different circuits 10 in an array of such. This operation is a form of correlated double sampling, and also reduces 1/f readout noise to some degree.

The circuit 100 suffers from the disadvantage of slow operation at low light levels when there is little photocurrent available to discharge node N10 and integration time is therefore undesirably long to obtain a measurable signal. Moreover, its linear response results in a simultaneous dynamic range significantly lower than that available from a logarithmic equivalent.

Production of circuits and detectors will now be discussed. A particular advantage of CMOS pixel circuits over cameras with CCD detectors is that the former can be built on standard CMOS foundry lines. Modem signal processing circuits are implemented by CMOS and are not readily achievable in a CCD process. A CCD detector consequently gives problems for production of processing and read-out circuitry.

Pixel circuits have an effective fill factor which is the ratio of photosensitive surface area to total illuminated area, and this may be increased to enhance sensitivity to incident radiation. Prior art circuits are normally covered with metal over most of their upper surfaces to shield them from illumination, leaving only their detectors exposed: this prevents photons reaching other diodes in such a circuit and generating parasitic photocurrent, but it reduces the effective fill factor.

The effective fill factor can be increased by removing the metal shield and allowing the entire pixel to be illuminated. This causes an increase in leakage current, but it is possible to achieve a gain in useful photocurrent which increases sensitivity sufficiently to outweigh leakage.

Figure 11:
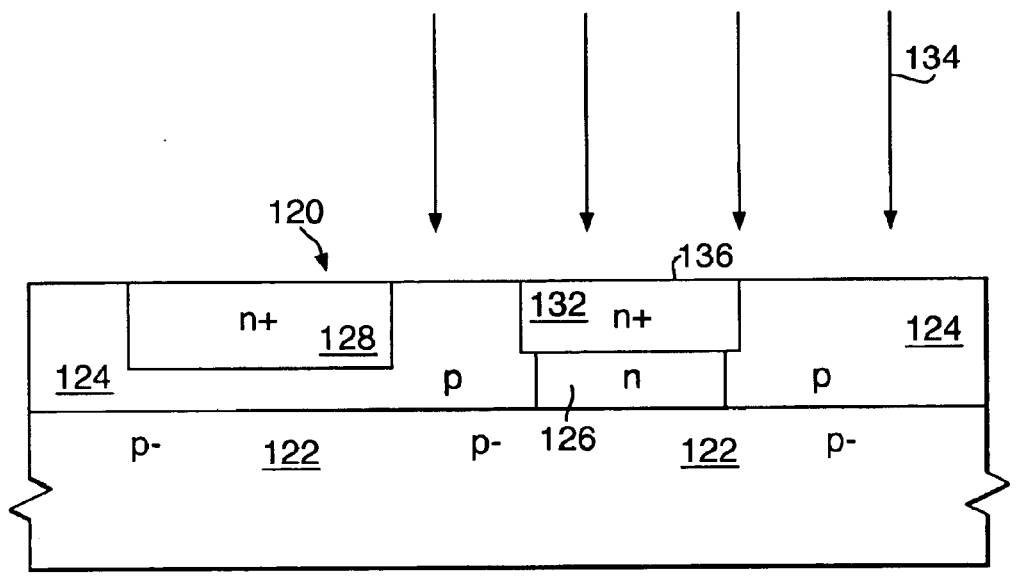
FIG. 11 illustrates a prior art (non-avalanche) photodiode detector structure.

FIG. 11 shows a prior art (non-avalanche) photodiode detector structure 120 comprising an epitaxially produced p− (lightly doped p-type) substrate 122 in which an annular p-type well 124 and a central n-type well 126 are produced by diffusion doping. The structure 120 has two n+ (heavily doped n-type) regions 128 and 132: of the latter, region 128 is part of external CMOS readout circuitry (not shown) as described earlier, and region 132 provides a contact to the n-well 126. Incident radiation is indicated by arrows such as 134. Most photons of this radiation are absorbed and most charge carriers are generated in the substrate 122 below the CMOS regions 124 to 132. A photodiode structure exists between the substrate 122 and the n+ regions 128 and 132, and it provides a large effective collection area for collection of photo-generated electrons: it has an internal electric field due to a depletion region and applied reverse bias voltage. There is an electrostatic barrier between the p− substrate 122 and the p-type well 124 due to the difference between their doping levels: when photocarriers (electron-hole pairs) are created by absorption of radiation in the substrate 122, this barrier stops electrons being collected until they diffuse to the vicinity of the n-well 126, which forms a pn junction with the substrate 122; the electric field at this junction drives electrons to the output contact region 132.

If its conventional metal or polymer light shield were removed from the structure 120, its upper surface 136 would be almost entirely exposed to incident radiation and would be photosensitive except where shielded by metal circuitry. This arrangement would result in increased photo-generated leakage current in p-n junctions that form part of CMOS readout circuitry connected to the structure 120, i.e. the junctions such as that between n+ region 128 and p well 124; leakage would however be compensated for by useful photocurrent generated in the substrate 122 and captured in the photodiode between wells 124 and 126.

Figure 12:
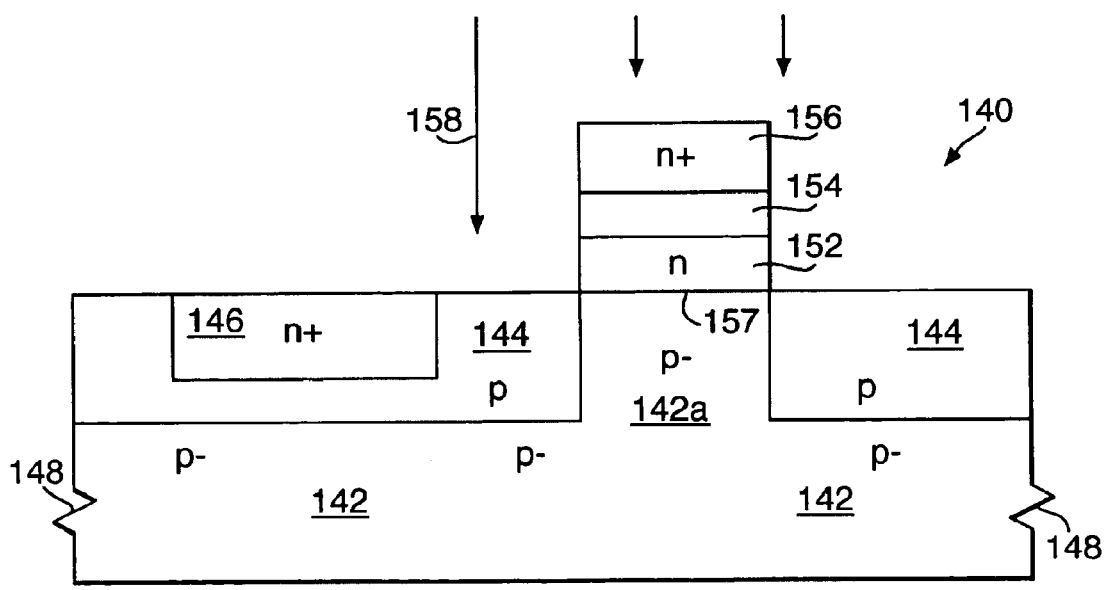
FIG. 12 illustrates an APD detector structure for a circuit of the invention employing high fill factor.

Referring now to FIG. 12, there is shown an APD detector structure 140 for a circuit of the invention employing high fill factor as described in relation to FIG. 11. It comprises an epitaxially produced p− silicon substrate 142 in which are implanted an annular p-type well 144 and an n+ region 146, the latter being part of external readout circuitry (not shown) as described earlier. As indicated by zigzag lines 148, the substrate 142 is much thicker than shown. The well 144 extends across the full width of the substrate 142 except for a region 142a of the latter beneath an APD 150. Upon the substrate region 142a successive epitaxial silicon layers epitaxially are grown, i.e. an n-type layer 152 supporting an undoped high resistance layer 154 in turn supporting an n+ layer 156 for connection to external circuitry. A pn diode junction 157 exists between the layer 152 and substrate region 142a which in operation is reverse biased and operates in sub-Geiger (current multiplication) mode as an APD. Under bias, the n-type layer 152 and the high resistance layer 154 are substantially fully depleted of charge carriers in the absence of illumination. The process of amplification or multiplication of charge carriers occurs in the high resistance layer 154.

Incident radiation is indicated by arrows such as 158. Most photons of this radiation are absorbed in the substrate 142 below the well 144 and APD 157, which gives a large effective light collection area or high fill factor. Reverse bias for the APD 157 means the n+ layer 156 is biased positive with respect to the p-type substrate region 142a, the latter having a substrate contact (not shown) for this purpose. Electron-hole pairs created by absorption of radiation in the substrate 142 and APD 157 are driven by this field to the n+ layer 156 (electrons) and region 146 (holes) respectively providing a photocurrent. The structure 140 is not shielded: its upper surface 146 is designed to be fully exposed to incident light ignoring circuitry giving a high fill factor and a high probability of detection of radiation. Moreover, the APD 157 provides the advantage of current gain which amplifies the photocurrent and increases output from the pixel circuit (not shown) in which it appears. It has an operating wavelength interval of 400 nm to 1000 nm, ie that of a silicon CMOS device.

Figure 13:
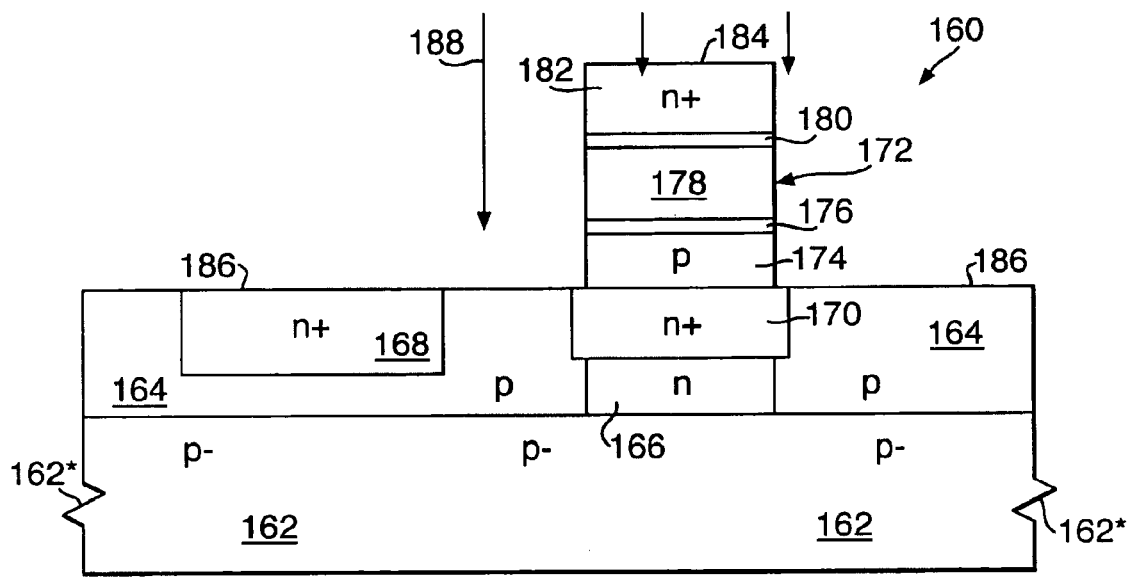
FIG. 13 shows schematically an APD detector structure for a circuit of the invention employing silicon-germanium alloy material.

An APD detector structure 160 is shown in FIG. 13 for a circuit of the invention employing silicon-germanium (SiGe) alloy material: use of this material increases operating wavelength interval and decreases APD bias voltage necessary to achieve appreciable current gain. It is also believed to improve device uniformity compared to standard CMOS. The structure 160 comprises an epitaxial p− silicon substrate 162 with implantation of an annular p-type well 164, a central n-type well 166 and an n+ region 168 for connection to external circuitry (not shown). Zigzag lines 162* indicate substrate thickness greater than shown. An n+ layer 170 is implanted into the central n-type well 166 and extends a little way into the surrounding p-type well 164. The structure 160 includes an APD in a PIN diode configuration indicated generally by 172 and comprising five successive layers of Si or SiGe alloy epitaxially grown on the n+ layer 172: i.e. in upward succession the APD 174 comprises a p-type Si layer 176, an undoped high resistance Si layer 176, an SiGe alloy layer 178, a an undoped high resistance Si layer 180, and an n+ Si layer 182 for connection to external circuitry. The SiGe layer 178 provides the main photon absorption region of the APD 172: it is strained due to lattice mismatch with the adjoining Si layers 176 and 180 and its thickness is as small as possible consistent with adequate absorption of photons. It may be replaced by an SiGe quantum well (QW) structure, i.e. $Si_{1-x}Ge_x$ where the value of the compositional parameter x alternates between two values between successive layers 10 nm thick in a QW structure containing e.g. 100 such layers.

The n+ layer 182 has an upper surface 184, and elsewhere the structure 160 has an upper surface 186. The structure 160 has not been validated and may require an additional bias connection to ensure that layers 170 and 174 to 182 are appropriately biased, because these form a PIN (p-type/intrinsic/n-type) diode back-to-back with a pn diode. Biasing of pn junctions is well known and presents no difficulty to those of ordinary skill in the art of semiconductor devices.

Incident radiation is indicated by arrows such as 188. As in structures such as 140 described earlier, in operation virtually the whole upper surface 184 and 186 is illuminated and most incident photons are absorbed in the substrate 162 giving high fill factor. To reverse bias the APD 172, the n+ layer 182 (and hence also the p-type layer 174) is biased positive with respect to the substrate layer 162. Photo-ionised electron-hole pairs created in the substrate 162 and APD 172 are driven by the APD's internal electric field to respective n+ layers 182 and 168 providing a photocurrent. As before, the structure 160 is unshielded for high fill factor, regions 164 and 166 form a pn+ diode between them which contributes to photocurrent, and the APD 172 provides current gain to amplify photocurrent and increase output. However, unlike earlier devices, the APD 172 has an extended long wavelength response compared to that of a silicon CMOS device: this is because the SiGe alloy layer 178 provides a photon absorption region with a smaller band gap than Si, and it also has the effect of reducing avalanche voltage of the APD 172 compared to a CMOS equivalent.

Figure 14:
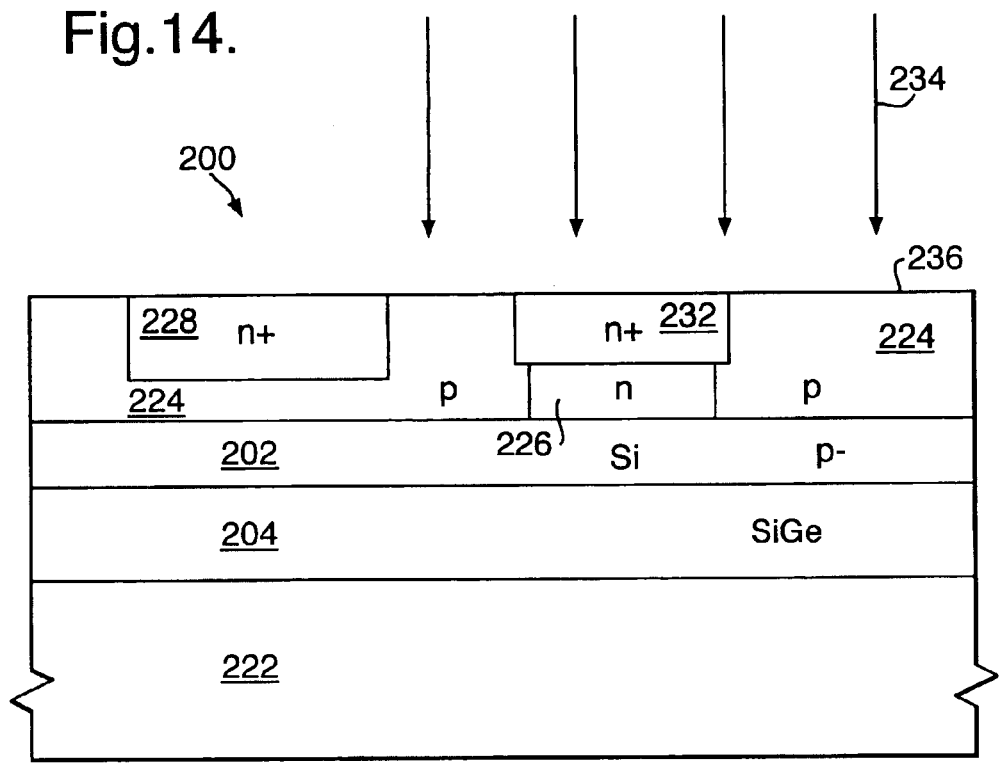
FIG. 14 shows schematically a detector structure for a circuit of the invention including a conventional photodiode on a CMOS-on-SiGe/Si substrate.

In an alternative aspect, the invention provides a pixel circuit including a conventional (i.e. non-APD) p-n diode on a CMOS-on-SiGe/Si substrate. Referring to FIG. 14, in which parts equivalent to those described earlier are like-referenced with a prefix 200 replacing 100, a photodiode detector structure 200 is shown which is equivalent to the structure 120 described earlier with introduction of epitaxially grown p− Si and SiGe substrate layers 202 and 204: these layers are introduced between a wafer substrate 222 and p-type and n-type wells 224 and 226. The SiGe layer 204 might instead be a quantum well structure as described earlier A low thermal budget CMOS process is used to fabricate CMOS readout circuitry (not shown) without causing major detriment to the epitaxial layers 202 and 204, which extend the structure's wavelength response. In other respects the parts and mode of operation of the structure 200 are as set out earlier and will not be described further.

Figure 15:
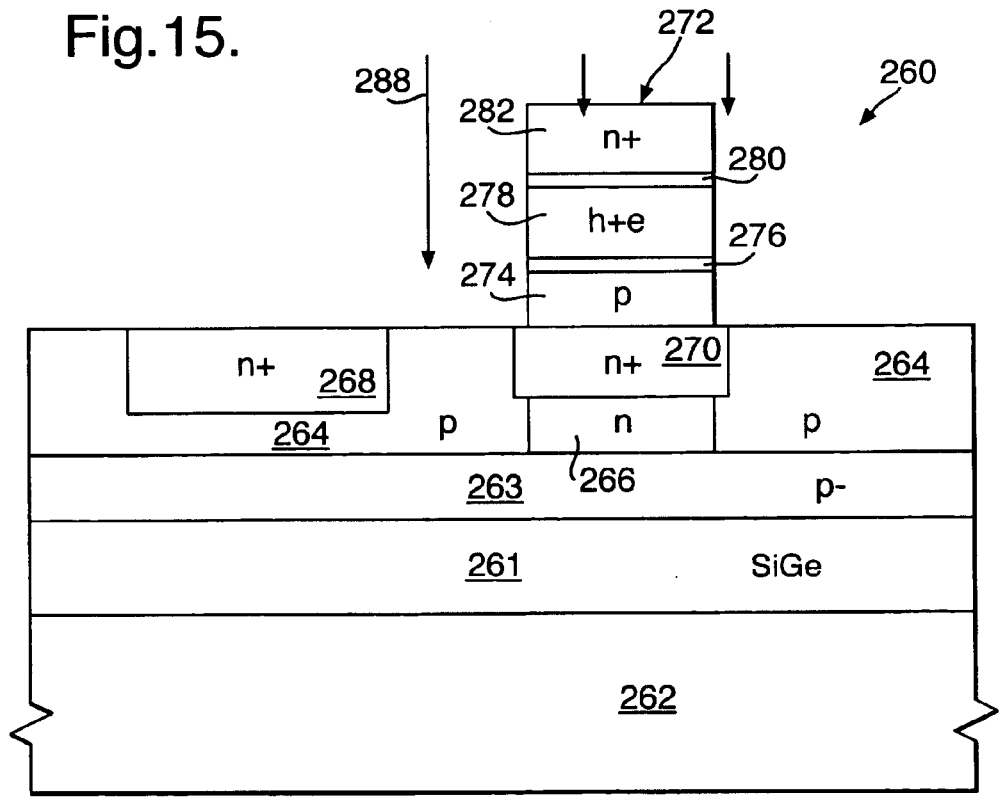
FIG. 15 is a schematic APD detector structure incorporating SiGe alloy on a CMOS-on-SiGe/Si substrate.

The invention also provides a pixel circuit including an APD structure on a CMOS-on-SiGe/Si substrate. Referring to FIG. 15, a photodiode detector structure 260 is shown including an epitaxially grown APD 272 incorporating SiGe alloy. It is equivalent to the structure 160 with epitaxially grown SiGe and p− Si substrate layers 261 and 263 introduced between p-type and n-type wells 264 and 266 and a wafer substrate 262. Here again, parts equivalent to those described earlier are similarly referenced with prefix augmented by 100. As before, the epitaxial SiGe substrate layer 261 provides an extended wavelength response, in addition to that of the APD 272. Other aspects of the structure 260 are as described earlier. Alternatively, a silicon APD equivalent to the APD 150 could be used to replace the APD 272. As a further alternative, an SiGe APD layer 278 may have a different proportion of Ge to that of the substrate layer 261. In particular, the SiGe APD layer 278 could be produced with a higher Ge proportion, if processing steps following its production are at a lower temperature. A higher Ge proportion in the APD 272 gives a response at longer wavelength than is possible in the substrate layer 261. The SiGe APD layer 278 might instead be a quantum well structure as described earlier.

The structure 260 may require a bias connection to ensure that layers 270 and 274 to 282 are appropriately biased: these form pin and pn diodes back-to-back. Biasing of such junctions is well known and presents no difficulty to those of ordinary skill in the art of semiconductor devices.

The structure 260 and its alternatives are detectors in which the functions of absorption/detection and multiplication are largely separate: most photons are absorbed and electron—hole pairs created in the relatively thick, low-field substrate regions such as 261 and 263, whereas multiplication of these carriers occurs when they are injected into the APD 272 when it is under sufficiently high electric field. Photon absorption is enhanced in the region 261 if it is a quantum well structure.

Compared to silicon, SiGe quantum wells have an increased absorption coefficient in the near infra red spectral region below 1500 nm. They give extended detector response beyond the silicon cut-off at about 1050 nm. They have a cut-off in the range 1300 nm to 1400 nm, depending on SiGe alloy composition and their efficiency of light confinement. A thin SiGe multiplication region—i.e. layer 278 in FIG. 15—has a lower bandgap than a silicon equivalent, and will provide current gain at a lower reverse bias voltage. This provides the possibility of arranging for multiplication to occur in the APD 272 at a bias voltage insufficient to produce substantial leakage or cause breakdown in other junctions of associated pixel circuitry.

Figure 16:
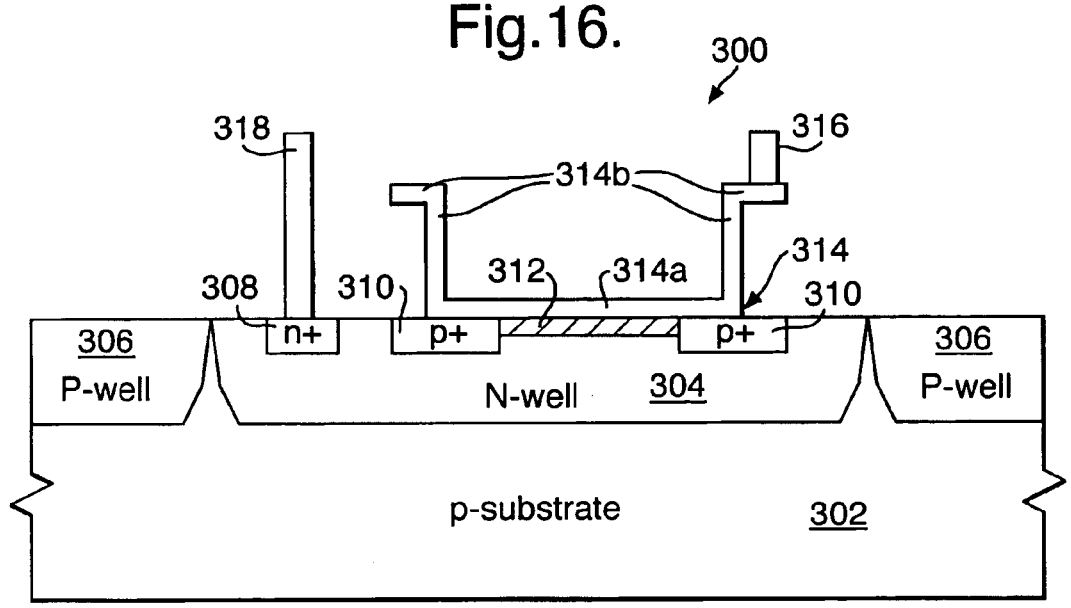
FIG. 16 is a schematic APD detector structure formed from an epitaxial layer on a CMOS substrate.

The invention also provides a pixel circuit including an APD structure formed by a combination of an epitaxial layer and a CMOS substrate. Referring to FIG. 16, a photodiode detector structure 300 is shown with a p− substrate layer 302 implanted to have a central circular n-well 304 surrounded by an annular p-well 306. The n-well 304 has implanted in it an n+ contact 308 and an annular p+ guard ring 310 appearing as two regions when seen in section in the drawing: across the full extent of that part of the nwell 304 which lies within the guard region 310, the n-well is implanted with a low dose of phosphorous or arsenic to provide a shallow n+ implant layer 312.

To fabricate the structure 300 up to and including implant layer 312, only standard CMOS processing is involved with consequent cost advantages. Thereafter epitaxy is employed to produce an heavily boron-doped p+ Si layer 314 over the implant layer 312, inner regions of the p+ guard ring 310 and over amorphous insulator (not shown): the layer 314 is epitaxial or single crystal Si at 314a where it is deposited upon crystalline material 310 and 312; it is polycrystalline at 314b where it is deposited upon amorphous insulator. It is sometimes referred to as "epi-poly Si". To simplify illustration and description, various layers that are present in practice (e.g. insulators) have been omitted from the drawing: i.e. there is no illustration of support structure for regions of the epi-poly Si layer 314 other than its central horizontal region. In practice the epi-poly Si layer 314 is produced by epitaxy into a hole in a layer structure overlying the n-well 304. It has a metal contact 316 for connection to an APD reverse bias voltage Vav, and another metal contact 318 is connected to the n+ contact 308 for signal output to pixel processing circuitry (not shown) as described in earlier embodiments.

The n+ implant layer 312 and the p+ epi-poly Si layer 314 are the electrically active regions of an avalanche photodiode of circular shape (seen side on in the drawing) defined within the guard ring 310, which itself forms an annular diode with the n-well 304. The implant and epi-poly Si layers 312 and 314 are both heavily doped and therefore low resistance: in consequence, a reverse bias (negative) voltage applied to the contact 316 appears largely at their interface which is an n+p+ junction, and therefore produces a larger electric field across this junction than that associated with the annular diode of the p+n guard ring—n-well combination in view of the lower n-well doping and consequent higher resistivity. The implant/epi-poly diode therefore avalanches at a lower reverse voltage than the annular diode, and so an avalanche would be confined to the former. Moreover, since the layer 314 is produced epitaxially, it is more controllable in structure than a conventional diffused or implanted CMOS layer, giving an APD with sub-Geiger and avalanche characteristics which are more uniform over its cross-section and APDs which are more uniform in different pixel circuits of an array. CMOS gives rise to APDs with a variety of gains and sub-Geiger and avalanche characteristics, so it is not possible to produce a pixel circuit array with acceptable matching between APDs in different circuits.

The epitaxial layer 314 also provides for current multiplication or gain to be obtainable without APD operation being undesirably near or going into breakdown, which is a problem in standard CMOS APDs produced wholly by implantation and/or diffusion. Finally, since by virtue of the guard ring 310 the implant/epi-poly diode is circular and the electric field across it has enhanced uniformity compared to CMOS: i.e. it is less subject to undesirable localised enhancement of electric field due to geometrical effects at corners or sharp edges which would give premature avalanching in small regions of the APD cross-section.

Uniformity is also improved because an avalanche photodiode substantially without corners produced within a generally circular, elliptical or oval guard ring will have better repeatability in manufacture than one with corners which are difficult to replicate over APDs in an array of pixels: it avoids corners and associated high field regions prone to premature breakdown and provides for current multiplication to be better distributed over the avalanche photodiode cross-section extending across the guard ring.

Figure 17:
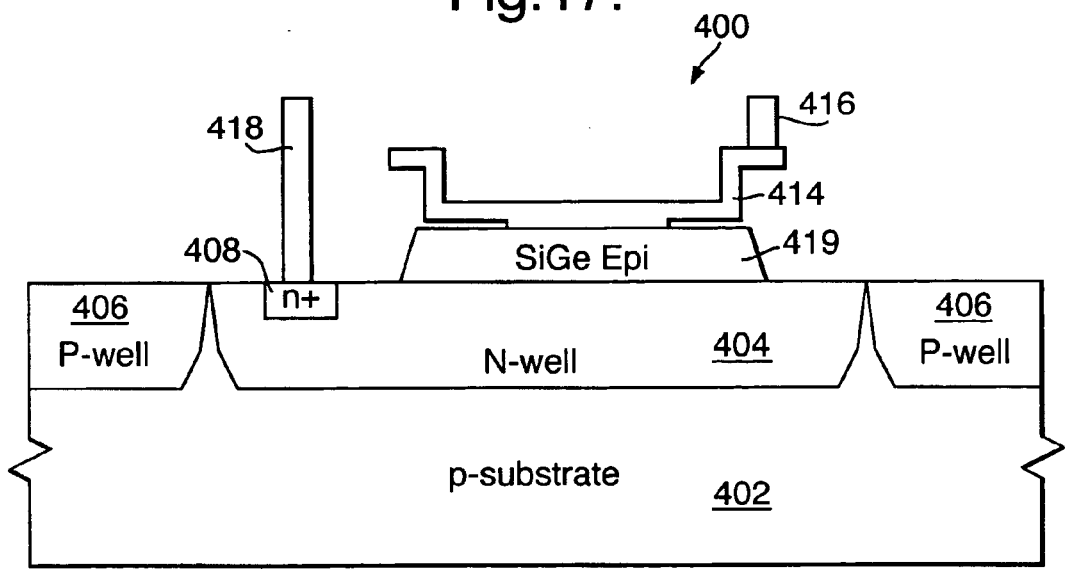
FIG. 17 illustrates an APD detector structure with epitaxial layers of Si and SiGe forming a PIN diode in combination with a CMOS substrate.

In another aspect, the invention provides a CMOS/epitaxy APD pixel circuit with an APD incorporating SiGe to extend long wavelength radiation response and reduce bias voltage requirements. Referring to FIG. 17, in which parts equivalent to those described in FIG. 16 are similarly referenced but augmented by 100, a photodiode detector structure 400 is shown having a p− substrate layer 402 implanted with a central circular n-well 404 surrounded by an annular p-well 406. The n-well 404 has an implanted n+ contact 408: the structure 400 is similar to the structure 300 except that there are no equivalents of the guard ring 310 and n+ implant 312, and the n-well 404 has grown epitaxially upon it a thin undoped SiGe layer 419, on which in turn a p+ epi-poly Si layer 414 is grown also epitaxially. Metal contacts 416 and 418 to the epi-poly layer 414 and n+ implant 408 provide connections to avalanche voltage Vav and external pixel circuitry respectively (not shown).

In combination, the n-well 404, the undoped SiGe layer 419 and the p+ epi-poly layer 414 are the electrically active regions of a PIN avalanche photodiode. Strictly speaking, the I layer will not be truly intrinsic (having both carrier types—electrons and holes—in like concentrations) but extrinsic (one carrier type) and of low doping. In Si "intrinsic" is a common misnomer indicating low doping. The band-gap of the SiGe "I" layer 419 of the diode is lower than that of the other two layers 404 and 414 which are Si, so current multiplication occurs in this layer before it can begin in an Si substrate diode between the n-well 404 and substrate 402. Because the SiGe layer 419 is produced epitaxially, its geometry and composition are more accurately defined than a CMOS equivalent, and this gives improved APD performance characteristics in addition to enhanced long wavelength response. The SiGe layer 419 may be replaced by a quantum well structure of layers of the $Si_{1-x}Ge_x$ material system where the value of the compositional parameter x changes between successive layers, as indicated in earlier embodiments.

Figure 18:
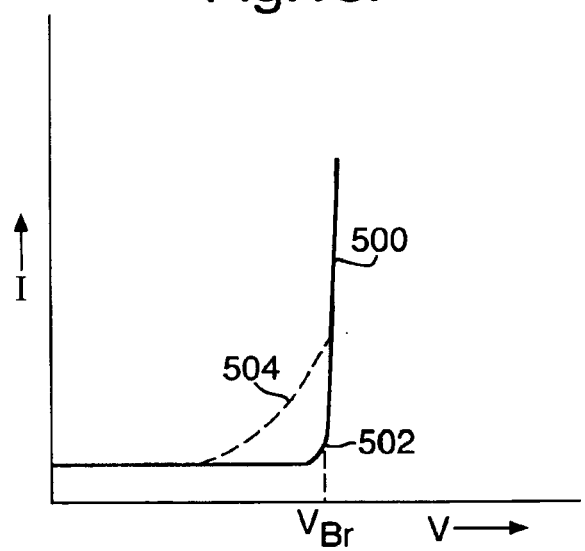
FIG. 18 shows IV curves for CMOS and epitaxial diodes.

Referring now to FIG. 18, there is shown a current/voltage (IV) graph 500 (not to scale) for a reverse-biased avalanche photodiode manufactured by a CMOS process. The graph has a sharp knee 502 ending at a voltage $V_{Br}$ at which breakdown occurs. An avalanche photodiode required to operate in sub-Geiger mode operates at a voltage $V_{Op}$ lower than $V_{Br}$ but sufficiently close to $V_{Br}$ for current multiplication to occur—i.e. $V_{Op}$ is on the knee 502 but below $V_{Br}$. This leads to a problem when it is required to make an array of pixel circuits each using sub-Geiger current multiplication: the problem is that $V_{Br}$ will differ for different avalanche photodiodes due to differences in construction and doping within manufacturing tolerances. In consequence, under a common reverse bias voltage, the avalanche photodiodes in an array will all have different voltages relative to their respective $V_{Br}$: i.e. ($V_{Br}$-$V_{Op}$) will vary across the array and so also will the degree of current multiplication they provide, because multiplication increases with proximity of $V_{Op}$ to $V_{Br}$. This is a problem because the sharpness of the knee 502 means that $V_{Op}$ must be very close to $V_{Br}$ to get current multiplication, and variation in $V_{Br}$ in CMOS avalanche photodiodes makes a constant degree of current multiplication very difficult to achieve reliably in pixels of an array.

However, it has been found that avalanche photodiodes produced by an epitaxial process do not exhibit as sharp a knee as 502: instead they exhibit a knee indicated schematically by a chain curve 504 along which the rate of change of current with respect to voltage dI/dV is much more gradual than at the knee 502. As a result variation in ($V_{Br}$-$V_{Op}$) for epitaxially produced photodiodes has much less effect on degree of current multiplication than in photodiodes produced by a CMOS route.

Referring now to FIGS. 19 and 20, in which like elements are like-referenced, there are shown sectional views of two stages in the production of an avalanche photodiode pixel circuit of the invention. In FIG. 19, a π (substantially undoped, weak residual p type) Si or SiGe alloy substrate 600 bears an insulating SiO$_2$ layer 602 from which a cross-hatched circular central region 604 is to be removed. A CMOS process is used to produce Si pixel readout circuitry 606 annular in shape, which lies on the insulating layer 602 but not upon the region 604.

The central region 604 is removed and further processing is carried out to yield the device shown in FIG. 20. An n+ annular guard ring 612 is created by diffusing donor impurities into the substrate 600. An amorphous second SiO$_2$ insulation layer 618 is then deposited over the CMOS circuitry 606, the guard ring 612 and the central region of the substrate 600 within the guard ring 612: a hole is then etched through this second insulation layer 618 to expose the inner half of the upper surface of the guard ring 612 and the central region of the substrate 600 within it. A shallow p type layer 614 less than or equal to 50 nm thick is created within the guard ring 612 by diffusing acceptor impurities into the substrate 600.

A ν (substantially undoped, weak residual n type) Si or SiGe layer 616 is then epitaxially grown upon the shallow layer 614 and upon the inner part of the guard ring 612. Epitaxy allows the layer thickness to be controlled accurately and the layer composition to be varied: both these factors determine the photodiode breakdown voltage, which can be tailored appropriately. The hole through the second insulation layer 618 is then etched again to expose the outer half of the upper surface of the guard ring 612. An n+ (heavily doped n-type) epi-poly layer 620 is now deposited over the second SiO$_2$ insulation layer 618, the ν layer 616 and the outer part of the guard ring 612: as described in earlier embodiments, the epi-poly layer 620 is epitaxial (single crystal) Si at 620*a* where it is deposited upon crystalline material 612 and 614; it is polycrystalline at 620*b* where it is deposited upon the amorphous insulation layer 618. Connections (not shown) to the CMOS circuitry 606 are produced by etching holes through the layers 620 and 618 and depositing conducting material therein.

The substrate 600 and layers 614, 616 and 620 in combination provide a pνn+ (PIN) avalanche photodiode structure: the layer 620 provides one electrical contact to this structure, and a second such contact (not shown) is made to the substrate 600. When this structure is electrically reverse biased, a high electric field appears across the ν layer 616 taking it towards breakdown and providing current multiplication. The n+ layer 620 is electrically connected to the n+ guard ring 612, and so in operation these two are at the same potential. Because the ν layer 616 is epitaxially produced, as discussed in relation to FIG. 18, and as compared to a CMOS equivalent, the photodiode 600/614/616/620 has a smaller rate of change of current near the knee of its IV curve above which breakdown occurs: it is consequently much more suitable for producing an array of avalanche photodiodes with similar current multiplication values.

The insulating layer 602 isolates the CMOS circuitry 606 from the substrate 600 and therefore also from the avalanche photodiode 600/614/616/620. This allows a higher bias voltage to be applied to the avalanche photodiode 600/614/616/620 without affecting the CMOS circuitry supply voltage. Photosensitive regions of the CMOS circuitry 606 are shielded (not shown) from incident radiation in a known manner. Other regions of the upper parts of the avalanche photodiode 600/614/616/620 are largely transparent to incident radiation, which passes through them for absorption in the relatively much thicker substrate 600. This absorption provides current in the photodiode 600/614/616/620 and improves efficiency.

In operation of the avalanche photodiode 600/614/616/620, the ν layer 616 provides a region of relatively high electric field compared to other photodiode regions. It is advantageous for this region to be thin to reduce avalanche breakdown voltage $V_{Br}$. This voltage can be reduced still further by using SiGe alloy for all or part of the ν layer 616.

The avalanche photodiode structure illustrated in FIG. 20 is based on an Si or SiGe substrate 600 and a photodiode 600/614/616/620 both insulated from CMOS readout circuitry 606: the substrate 600 is relatively thick for good absorption of radiation and the insulation 602 allows the photodiode 600/614/616/620 to be biased independently of the CMOS circuitry 606. The substrate thickness is not subject to limitations such as the depth of a diffusion well.

The use of epitaxy to produce the high field region of ν layer 616 gives better control over layer thickness and composition than a CMOS equivalent, which is particularly important when producing an array of photodiode pixel circuits where uniformity over the array is needed. The guard ring 612 avoids sharp corners and the premature breakdown to which they give rise; doped layers 614 and 620 help shape the internal electric field distribution in the ν layer 616: both the guard ring 612 and the doped layers 614 and 620 therefore contribute to making the photodiode 600/614/616/620 capable of controllable or 'soft' avalanche multiplication below breakdown.

The isolation provided by the SiO$_2$ layer 602 enables operation of the CMOS readout circuit 606 to be unaffected by photodiode bias voltage: it allows photodiode bias voltage to be higher than the CMOS bias voltage where necessary. This is assisted by the use of epitaxy to produce the ν layer 616, which enables this layer to be thin for high electric field and consequently photodiode breakdown voltage to be low. Epitaxy also enables the absorption and avalanche multiplication regions of the photodiode structure to be separated: this allows the absorption region to be thick for good absorption and photocurrent generation while keeping the multiplication region thin.

Avalanche photodiodes produced as indicated in FIGS. 19 and 20 are suitable for use biased below breakdown and either relatively near or relatively far from breakdown. If biased relatively near breakdown, they operate in the sub-Geiger region as has been said: this is useful for current multiplication of small photo-induced currents arising from low illuminating light intensity levels (night time). If biased relatively far from breakdown they operate as ordinary photodiodes without current multiplication: this mode of operation is suitable for high light intensity levels (daytime). These two modes of operation mean that a single photodiode array can monitor vastly (orders of magnitude) different light intensity levels by changing bias voltage.

What is claimed is:

1. A photodetector circuit comprising:
   a photodiode detector, said photodetector having a PN structure with p-type and n-type active regions;
   a readout circuit, said readout circuit at least partly incorporated in a CMOS component and having a guard ring delimiting and surrounding the photodiode detector for enhancing electric field uniformity and inhibiting breakdown; and
   a deposited epitaxial layer supported by said CMOS component, said epitaxial layer providing only one of said active regions, said readout circuit and said epitaxial layer adapted to provide a gradual knee in a current-voltage characteristic.

2. A photodetector circuit according to claim 1 wherein the CMOS component comprises a substrate supporting and insulated from at least a portion of said CMOS readout circuit, the photodiode detector is operable in current multiplication mode and the epitaxial layer is deposited upon the substrate.

3. A photodetector circuit according to claim 2 wherein the photodiode detector is an avalanche photodiode and said photodiode active regions comprise one active region incorporated in the substrate, and the epitaxial layer is a layer deposited upon the one active region and provides the other active region of the photodiode.

4. A photodetector circuit according to claim 1 wherein said readout circuit is arranged to provide said photodiode detector with a logarithmic response to incident radiation.

5. A photodetector circuit according to claim 1, wherein said readout circuit incorporates parasitic photodiodes, arranged in series with said readout circuit, for contributing to circuit output in response to incident radiation.

6. A photodetector circuit according to claim 1, wherein said readout circuit includes an amplifier arranged in a feedback loop for providing feedback to stabilise photodiode detector bias voltage.

7. A photodetector circuit according to claim 6, wherein the amplifier is arranged to amplify an output signal from the photodiode detector and to provide feedback to bias a load transistor in series with the photodiode detector.

8. A photodetector circuit according to claim 7, wherein the amplifier is a push-pull amplifier.

9. A photodetector circuit according to claim 7, wherein said readout circuit includes a cascode transistor arranged to reduce Miller Effect capacitance in the amplifier.

10. A photodetector circuit comprising:
    a photodiode detector, said photodetector having a PIN structure, said structure having first, second and third active regions, one active region p-type, one active region substantially undoped and one active region n-type;
    a readout circuit, said readout circuit at least partly incorporated in a CMOS component and having a guard ring delimiting and surrounding the photodiode detector for enhancing electric field uniformity and inhibiting breakdown; and
    a deposited epitaxial layer supported by said CMOS component, said epitaxial layer providing only one of said active regions, said photodiode detector, in response to said only one active region, having a gradual knee in a current-voltage characteristic.

11. A photodetector circuit according to claim 10 wherein the readout circuitry incorporates CMOS circuitry, the CMOS component comprises a substrate supporting and insulated from said CMOS circuitry, the photodiode detector is operable in current multiplication mode and the epitaxial layer is deposited upon the substrate.

12. A photodetector circuit according to claim 11, wherein the epitaxial layer provides a high field region.

13. A photodetector circuit according to claim 11, wherein the epitaxial layer comprises a first epitaxial layer supporting a second epitaxial layer, said first epitaxial layer providing said second active region and said second epitaxial layer, on said first epitaxial layer, comprising said third active region of the photodiode.

14. A photodetector circuit according to claim 13, wherein the third active region is electrically connected to the guard ring and has like potential therewith during circuit operation.

15. A photodetector circuit according to claim 10, wherein said readout circuit includes at least one circuit element arranged to provide said photodiode detector with a logarithmic response to incident radiation.

16. A photodetector circuit according to claim 10, wherein said readout circuit incorporates parasitic photodiodes arranged in series with said readout circuit, for contributing to circuit output in response to incident radiation.

17. A photodetector circuit according to claim 10, wherein said readout circuit includes an amplifier arranged in a feedback loop for providing feedback to stabilise photodiode detector bias voltage.

18. A photodetector circuit according to claim 17, wherein the amplifier is arranged to amplify an output signal from the photodiode detector and to provide feedback to bias a load transistor in series with the photodiode detector.

19. A photodetector circuit according to claim 18, wherein the amplifier is a push-pull amplifier.

20. A photodetector circuit according to claim 18, wherein said readout circuit includes a cascode transistor arranged to reduce Miller Effect capacitance in the amplifier.

21. A photodetector circuit according to claim 10, wherein the CMOS component is a substrate supporting and insulated from CMOS circuitry, the photodiode detector comprises a region of one conductivity type incorporated in the substrate, and the epitaxial layer comprises a first epitaxial layer supporting a second epitaxial layer, one of said epitaxial layers is substantially undoped and the other of said epitaxial layers is of opposite conductivity type to that of the region incorporated in the substrate, the region in the substrate and the two epitaxial layers comprising a PIN diode.

22. A photodetector circuit according to claim 21, wherein the undoped epitaxial layer is one of a SiGe alloy and a quantum well structure of the $Si_{1-x}Ge_x$ material system where the value of the compositional parameter x changes between successive layers.

23. An array of photodetector circuits, each photodetector circuit comprising:
    a photodiode detector, said photodiode detector having a PN structure with p-type and n-type active regions;
    a readout circuit, said readout circuit being at least partly incorporated in a CMOS component and having a guard ring delimiting and surrounding the photodiode detector for enhancing electric field uniformity and inhibiting breakdown; and
    a deposited epitaxial layer supported by the CMOS component, the epitaxial layer providing only one of said active regions of the photodiode detector, the photodiode detector, in response to said only one active region, having a gradual knee in a current-voltage characteristic.

24. An array of photodetector circuits, each photodetector circuit comprising:

a photodiode detector, said photodiode detector having PIN structure, said structure having three active regions, one active region p-type, one active region substantially undoped and one active region n-type;

a readout circuit, said readout circuit being at least partly incorporated in a CMOS component and having a guard ring delimiting and surrounding the photodiode detector for enhancing electric field uniformity and inhibiting breakdown; and a deposited epitaxial layer supported by the CMOS component and providing only one of said active regions of the photodiode detector, the photodiode detector, in response to said only one active region, having a gradual knee in a current-voltage characteristic.

25. A method of making a photodetector circuit including a photodiode detector, comprising the steps of:

forming at least part of a readout circuit as a CMOS component, the readout circuit having a guard ring for delimiting and surrounding the photodiode detector for enhancing electric field uniformity and inhibiting breakdown; and a photodiode detector, forming a deposited epitaxial layer supported by the CMOS component to produce said photodiode detector having a PN structure with p-type and n-type active regions, the epitaxial layer providing only one of said active regions, the photodiode detector, in response to said only one active region, having a gradual knee in a current-voltage characteristic.

26. A method of making a photodetector circuit including a photodiode detector comprising the steps of:

forming at least part of a readout circuit as a CMOS component, the readout circuit having a guard ring for delimiting and surrounding the photodiode detector for enhancing electric field uniformity and inhibiting breakdown; and a photodiode detector, forming a deposited epitaxial layer supported by the CMOS component to produce said photodiode detector having PIN structure with three active regions, one active region p-type, one active region substantially undoped and one active region n-type, the epitaxial layer providing only one of said active regions, the photodiode detector, in response to said only one active region, having a gradual knee in a current-voltage characteristic.

27. An array of photodetector circuits, each photodetector circuit comprising:

a photodiode detector, said photodiode detector having a PIN structure, said structure having three active regions, a first active region which is p-type, a second active region which is substantially undoped and a third active region which is n-type;

a readout circuit, said readout circuit at least partly incorporated in a CMOS component hand having a guard ring delimiting and surrounding the photodiode detector for enhancing electric field uniformity and inhibiting breakdown, said first active region being incorporated in the CMOS component;

said second active region being a first epitaxial layer deposited upon said first active region and providing and being coextensive in thickness with said second active region;

said third active region being a second epitaxial layer deposited upon said second active region and providing and being coextensive in thickness with said third active region; and respective conductivity junctions occurring at interfaces between said first epitaxial layer and said first active region and between said first epitaxial layer and said second epitaxial layer, the photodiode detector, in response to said first epitaxial layer and said second epitaxial layer, having a gradual knee in a current-voltage characteristic.

* * * * *